United States Patent [19]

Wilcox

[11] 4,346,351

[45] Aug. 24, 1982

[54] HIGH FREQUENCY VOLTAGE-CONTROLLED OSCILLATOR

[75] Inventor: Milton E. Wilcox, San Jose, Calif.

[73] Assignee: National Semiconductor Corporation, Santa Clara, Calif.

[21] Appl. No.: 125,606

[22] Filed: Feb. 28, 1980

[51] Int. Cl.³ ............................................. H03B 5/12
[52] U.S. Cl. ............................ 331/117 R; 331/108 D
[58] Field of Search ........... 331/117 R, 108 C, 108 D, 331/177 R, 176

[56] References Cited

U.S. PATENT DOCUMENTS 3,963,996  6/1976  Skerlos ........................... 331/117 R
4,063,193  12/1977  Wilcox ....................... 331/108 D X Primary Examiner—Siegfried H. Grimm
Assistant Examiner—Edward P. Westin
Attorney, Agent, or Firm—Gail W. Woodward; James A. Sheridan; Neil B. Schulte

[57] ABSTRACT

A differential oscillator is supplied with a constant total current. A signal-controlled single-ended shunt circuit bypasses current around the oscillator thus varying the tail current oppositely. This in turn varies the signal delay in the oscillator transistors and hence oscillator frequency.

8 Claims, 2 Drawing Figures

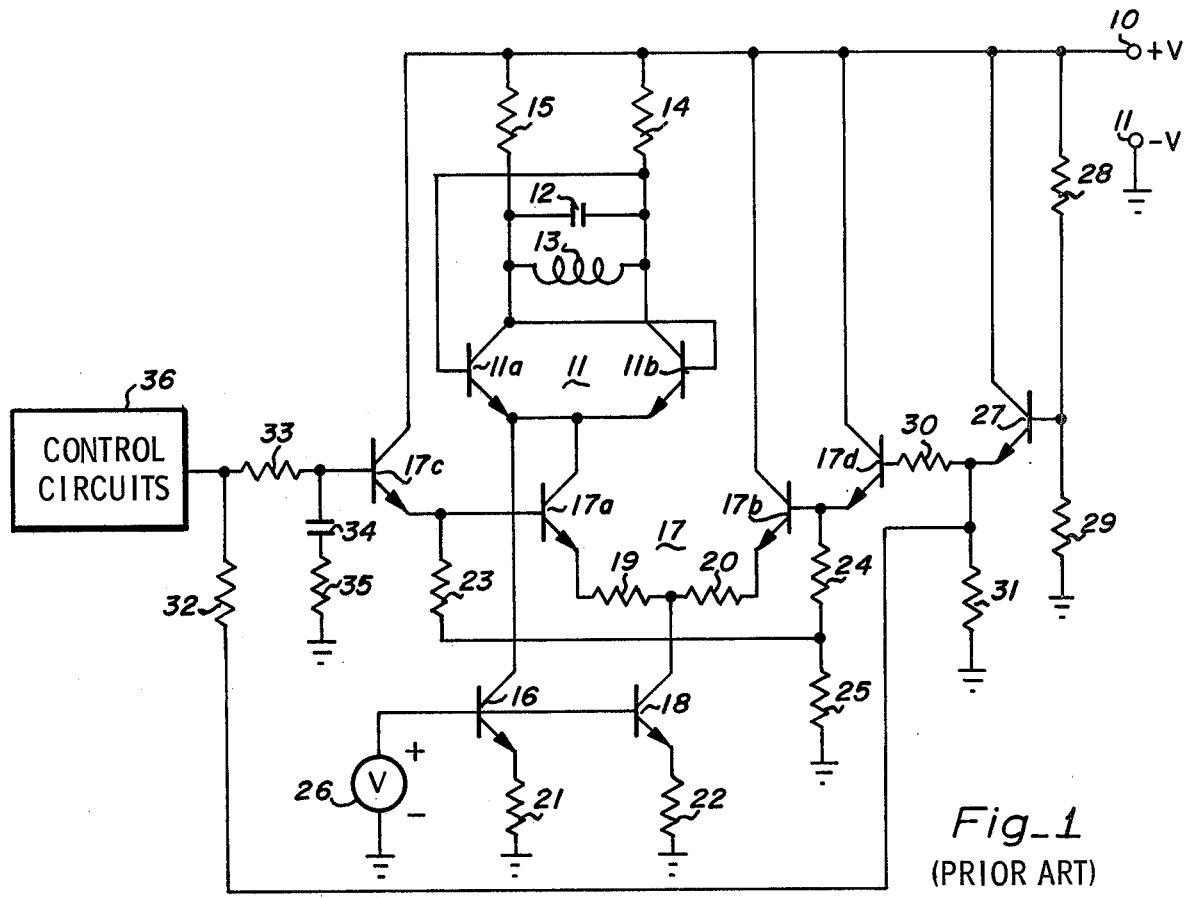
*Fig_1*
(PRIOR ART)
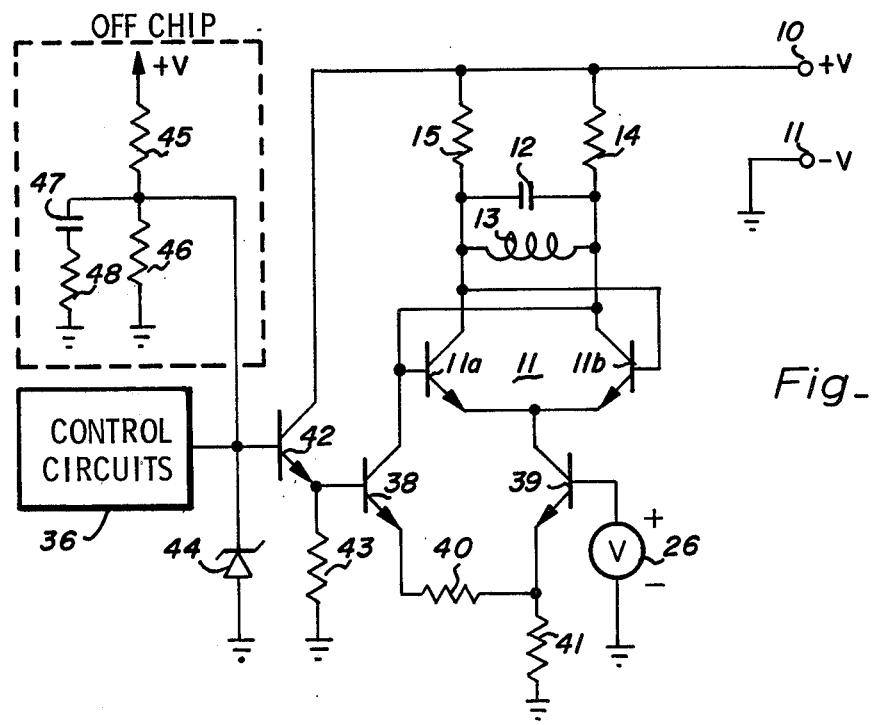
*Fig_2*

HIGH FREQUENCY VOLTAGE-CONTROLLED OSCILLATOR

BACKGROUND OF THE INVENTION

Voltage Controlled Oscillators (VCOs) are useful in Phase Locked Loop (PLL) circuits in which an oscillator responding to an error voltage is driven to reduce the error to minimum or zero. Typically, a phase detector is coupled to the oscillator which is driven to provide a particular signal phase. Such oscillators in the past have been rather complicated and required a large number of parts. Furthermore, their temperature drift is typically complex and uncompensated.

SUMMARY OF THE INVENTION

It is an object of the invention to simplify and reduce the parts count in a VCO.

It is a further object of the invention to provide single ended control of a VCO.

It is a still further object of the invention to temperature compensate a VCO.

It is a still further object of the invention to limit the signal response in a single ended control VCO.

These and other objects are achieved in a circuit that employs a differential oscillator in which the tail current is varied to change oscillator frequency. This can be done in an oscillator stage employing cross-connected transistors that are driven into saturation by the oscillation signal. In a saturated transistor the signal delay is a function of the operating current. The greater the current, the greater the delay and the lower the freqency of oscillation. Such an oscillator is operated where minority carrier storage amounts to an appreciable fraction of the oscillation cycle. Using the conventional NPN transistor in Integrated Circuit (IC) configurations, such oscillators are feasible in the 5 MHz to 200 MHz region.

According to the invention, a single ended control circuit shunts current around the oscillator transistors. Due to the constant circuit current the tail current varies in the opposite direction, thus changing oscillator frequency. A limiter circuit avoids excessive shunt current.

BRIEF DESCRIPTION OF THE DRAWING

FIG. 1 is a schematic diagram of a prior art VCO; and
FIG. 2 is a schematic diagram of the circuit of the invention.

DESCRIPTION OF THE PRIOR ART

With reference to FIG. 1 a prior art VCO circuit is shown. A power supply connected between terminals 10 and 11 operates the circuit. The heart of the circuit is a differential oscillator 11. Transistors 11a and 11b have balanced load resistors 14 and 15. Inductor 13 and capacitor 12 comprise a frequency determining antiresonant tank. The transistor bases are cross coupled to complete the oscillator circuit. The transistors are operated in a frequency regime where they introduce appreciable signal delay. Thus, the oscillation frequency is a function of transistor delay which can be varied as a function of current.

Transistor 16 which is biased from a constant voltage source 26 supplies a fixed minimum current to oscillator 11. This current will be set by resistor 21.

Differential amplifier 17, which includes transistors 17a thru 17d, provides a variable oscillator current. Transistor 17a supplies a variable tail current to oscillator 11 and transistor 17b shunts current around oscillator 11. Differential amplifier 17 is supplied with tail current from transistor 18 at a level set by resistor 22. Resistors 19 and 20 degenerate differential amplifier 17. Transistors 17c and 17d are directly coupled emitter follower stages that drive transistors 17a and 17b respectively. Resistor 25 provides tail current to transistors 17c and 17d while resistors 23 and 24 degenerate them.

Transistor 27, as biased by resistors 28 and 29, provides a reference voltage at its emitter across resistor 31 for differential amplifier 17. Resistor 30 couples the reference voltage to the base of transistor 17d. Resistors 32 and 33 couple the reference voltage to the base of transistor 17c whereby the differential amplifier 17 is balanced at zero input.

Resistors 33 and 35 along with capacitor 34 provides low pass input filter action. The circuit input is operated by control circuits in block 36.

In operation, the input from block 36 produces current changes in tail current transistor 17a and shunting transistor 17b in opposite directions. As the tail current rises, the shunt current decreases and the oscillator frequency decreases due to increased delay in oscillator transistors 11a and 11b.

DESCRIPTION OF THE INVENTION

FIG. 2 shows the circuit of the invention which is intended for IC implementation. Where circuit elements are like those of FIG. 1, similar part numbers are employed. The oscillator 11 is the same as that of FIG. 1. However, transistor 39 sets the oscillator tail current while transistor 38 shunts current around the oscillator.

A constant voltage, typically about 1.7 volts, is applied to the base of transistor 39 and resistor 41 determines the total current. Resistor 40 determines the value of current shunted around oscillator 11.

Transistor 42 is an emitter follower with load resistor 43 and is directly coupled to the base of transistor 38. Control circuits 36 operate the input with zener diode 44 limiting the maximum positive excursion. Normally diode 44 is biased below its zener level by resistors 45 and 46, which act as a voltage divider providing a quiescent input voltage to said diode. The diode having a zener voltage greater than the quiescent input voltage and less than the supply voltage to the oscillator. Resistor 48 and capacitor 47 provide the low pass input filter action. Components 45 through 48 are normally exterior to the IC.

Input variations are directly coupled via emitter follower 42 to the base of transistor 38. This directly varies the shunt oscillator current and, due to common resistor 41, varies the oscillator tail current in the opposite direction. The current flowing in resistor 41 is relatively constant because the voltage across it is one $V_{BE}$ below the value of source 26.

As the input voltage rises, the drop across resistor 40 increases. Thus, more current is shunted around the oscillator and less tail current flows. For this condition the oscillator frequency increases. As the input voltage falls, less current flows in transistor 38 and the shunt current decreases. This increases oscillator tail current and decreases its frequency.

Such an oscillator is subject to frequency drift with temperature. For example, in the basic oscillator as temperature increases the $V_{BE}$ of transistor 39 decreases. This pulls the emitter toward the level set by source 26. This in turn produces more tail current and a frequency decrease. In addition, the signal delay in the oscillator tends to increase with temperature, which further decreases the oscillation frequency. In the circuit shown, the $V_{BE}$ values of transistors 38 and 42 both decrease, thereby increasing the oscillator shunt current. This temperature drift is opposite to that of the oscillator, thus providing temperature compensation.

EXAMPLE

The circuit of FIG. 2 was constructed using typical IC NPN transistors. The following component values were used.

| COMPONENT | VALUE |
| --- | --- |
| Resistors 14 and 15 | 750 ohms |
| Resistor 40 | 1.6K ohms |
| Resistor 41 | 285 ohms |
| Source 26 | 1.7 volts |
| Resistor 43 | 10K ohms |
| Diode 44 | 5.6V zener |
| Resistor 45 | 62K ohms |
| Resistor 46 | 30K ohms |
| Capacitor 47 | 0.22 microfarad |
| Resistor 48 | 100 ohms |

Parts 45 thru 48 were designed to be off-chip parts. The supply at terminal 10 was +6 volts with respect to ground. Resistor 45 was returned to a 12-volt external supply. Tank circuit components 12 and 13 were selected to resonate at 46 MHz. Varying the input voltage at the base of transistor 42 from a nominal 4 volts produced oscillator current variations at the emitters of transistors 11a and 11b from 1.5 milliamperes to 3.5 milliamperes. This produced a frequency change, $\Delta F$, of about 4 MHz.

While the prior art implementation requires sixteen resistors and nine transistors, the circuit of the invention employs eight resistors and five transistors. Thus, the invention saves four transistors and eight resistors. This will be of substantial benefit in IC construction.

Additionally, the prior art circuit requires a higher operating voltage which is undesirable.

The invention has been described and a working example given. Clearly, when a person skilled in the art reads the foregoing, alternatives and equivalents within the spirit and intent of the invention will occur to him. Accordingly, it is intended that the scope of the invention be limited only by the following claims.

I claim:

1. A voltage controlled oscillator circuit comprising:
   differential oscillator means including a pair of differentially connected transistors, a pair of load resistors coupled between one terminal of a source of supply voltage and the collectors of said pair of transistors, direct cross connections between the base-collector circuits of said pair of transistors and a tuned antiresonant circuit coupled between said collectors;
   a current source transistor having its base returned to a constant potential, its emitter returned by means of a resistor to the other terminal of said source of supply voltage and a collector coupled to said oscillator means; and
   a shunting transistor having its emitter-collector circuit coupled between one of said differential oscillator collectors and said emitter of said current source transistor, an emitter follower driver coupled to the base of said shunting transistor, and control signal means coupled to the input of said emitter follower driver whereby the curent in said oscillator means is varied, thereby varying its frequency.

2. The circuit of claim 1 further including means for limiting the control signal variation to avoid excessive shunting.

3. The circuit of claim 1 wherein a resistor couples said emitter of said shunting transistor to said emitter of said current source transistor.

4. The circuit of claim 3 further including a reverse biased zener diode coupled across the input to said emitter follower driver, means for providing a quiescent input voltage to said zener diode, said diode having a zener voltage greater than the quiescent input voltage and less than the supply voltage to said oscillator means.

5. A voltage controlled oscillator having an input terminal for control signal application, said circuit comprising:
   first and second power supply rails connectible to a source of operating voltage;
   first and second transistors having their emitters coupled together and their bases cross coupled to the opposite collector;
   first and second resistor means coupled between said first rail and respectively to said collectors of said first and second transistors;
   means for coupling an antiresonant tank circuit between said collectors;
   a third transistor having its collector coupled to the emitters of said first and second transistors, its base coupled to a source of potential and an emitter;
   third resistor means coupled between said emitter of said third transistor and said second rail;
   a fourth transistor having its collector coupled to one of the collectors of said first and second transistors, a base and an emitter;
   fourth resistor means coupled between the emitters of said third and fourth transistors;
   a fifth transistor having an emitter coupled to said base of said fourth transistor, a collector coupled to said first rail and a base coupled to said input terminal;
   fifth resistor means coupled between said emitter of said fifth transistor and said second rail; and
   means for coupling a bias voltage to said base of said fifth transistor to set the quiescent operating point of said circuit.

6. The circuit of claim 5 further including means for coupling a zener diode between said base of said fifth transistor and said second rail, said diode being poled in reverse bias.

7. The circuit of claim 6 further including means for coupling low pass filter means between said input terminal and one of said rails.

8. The circuit of claim 5 wherein said circuit is in integrated circuit form, said transistors are of NPN construction and said tank circuit operates in the 5 MHz to 200 MHz range.

* * * * *